United States Patent
Shu

(10) Patent No.: US 9,385,032 B2
(45) Date of Patent: Jul. 5, 2016

(54) SYSTEMS AND METHODS INVOLVING DATA BUS INVERSION MEMORY CIRCUITRY, CONFIGURATION AND/OR OPERATION

(71) Applicant: GSI TECHNOLOGY, INC., Sunnyvale, CA (US)

(72) Inventor: Lee-Lean Shu, Los Altos, CA (US)

(73) Assignee: GSI TECHNOLOGY, INC., Sunnyvale, CA (US)

( * ) Notice: Subject to any disclaimer, the term of this patent is extended or adjusted under 35 U.S.C. 154(b) by 0 days.

(21) Appl. No.: 14/217,164

(22) Filed: Mar. 17, 2014

(65) Prior Publication Data
US 2014/0289440 A1 Sep. 25, 2014

Related U.S. Application Data

(60) Provisional application No. 61/800,844, filed on Mar. 15, 2013.

(51) Int. Cl.
*H01L 21/768* (2006.01)
*G11C 7/10* (2006.01)

(52) U.S. Cl.
CPC ........ *H01L 21/76838* (2013.01); *G11C 7/1006* (2013.01); *G11C 7/1012* (2013.01); *G11C 7/1048* (2013.01)

(58) Field of Classification Search
CPC ........... H01L 21/76838; G11C 7/1006; G11C 7/1012; G11C 7/1048
See application file for complete search history.

(56) References Cited

U.S. PATENT DOCUMENTS

| | | | |
|---|---|---|---|
| 6,356,485 B1 | 3/2002 | Proebsting | |
| 2003/0080773 A1* | 5/2003 | Bobba et al. | 326/21 |
| 2007/0300095 A1 | 12/2007 | Fee et al. | |
| 2008/0019451 A1 | 1/2008 | Jang et al. | |
| 2008/0126714 A1 | 5/2008 | Sibigtroth et al. | |
| 2009/0172449 A1* | 7/2009 | Zhang et al. | 713/324 |
| 2009/0179782 A1* | 7/2009 | Hollis | 341/55 |
| 2009/0182918 A1* | 7/2009 | Hollis | 710/106 |
| 2009/0313521 A1* | 12/2009 | Hollis | 714/752 |
| 2010/0214138 A1 | 8/2010 | Hollis | |
| 2012/0066570 A1 | 3/2012 | Brown et al. | |

(Continued)

FOREIGN PATENT DOCUMENTS

EP 0 241 129 10/1987

OTHER PUBLICATIONS

International Search Report and Written Opinion in related application No. PCT/US2014/030899 dated Oct. 29, 2014, 16 pgs.

(Continued)

*Primary Examiner* — Eric Oberly
(74) *Attorney, Agent, or Firm* — DLA Piper LLP (US)

(57) ABSTRACT

Systems, methods and fabrication processes relating to memory devices involving data bus inversion are disclosed. According to one illustrative implementation, a memory device may comprise a memory core, circuitry that receives a data bus inversion (DBI) bit associated with a data signal as input directly, without transmission through DBI logic associated with an input buffer, and circuitry that stores the DBI bit into the memory core, reads the DBI bit from the memory core, and provides the DBI bit as output. In further implementations, memory devices herein may store and process the DBI bit on an internal data bus as a regular data bit.

23 Claims, 15 Drawing Sheets

(56) References Cited

U.S. PATENT DOCUMENTS

2012/0221927 A1 8/2012 Moon
2012/0243301 A1 9/2012 Maheshwari et al.

OTHER PUBLICATIONS

Invitation to Pay Additional Fees and, Where Applicable, Protest Fee in related application No. PCT/US2014/030899, dated Aug. 20, 2014, 2 pgs.

PCT International Preliminary Report on Patentability of PCT/US14/30899; dated Sep. 15, 2015; (12 pgs.).
PCT International Search Report of PCT/US14/30882; dated Nov. 7, 2014; (4 pgs.).
PCT Written Opinion of the International Searching Authority of PCT/US14/30882; dated Nov. 7, 2014; (9 pgs.).
File history of corresponding U.S. Appl. No. 14/217,343, filed Mar. 17, 2014.
PCT International Preliminary Report on Patentability of PCT/US14/30882, dated Sep. 15, 2015; (10pgs).

* cited by examiner

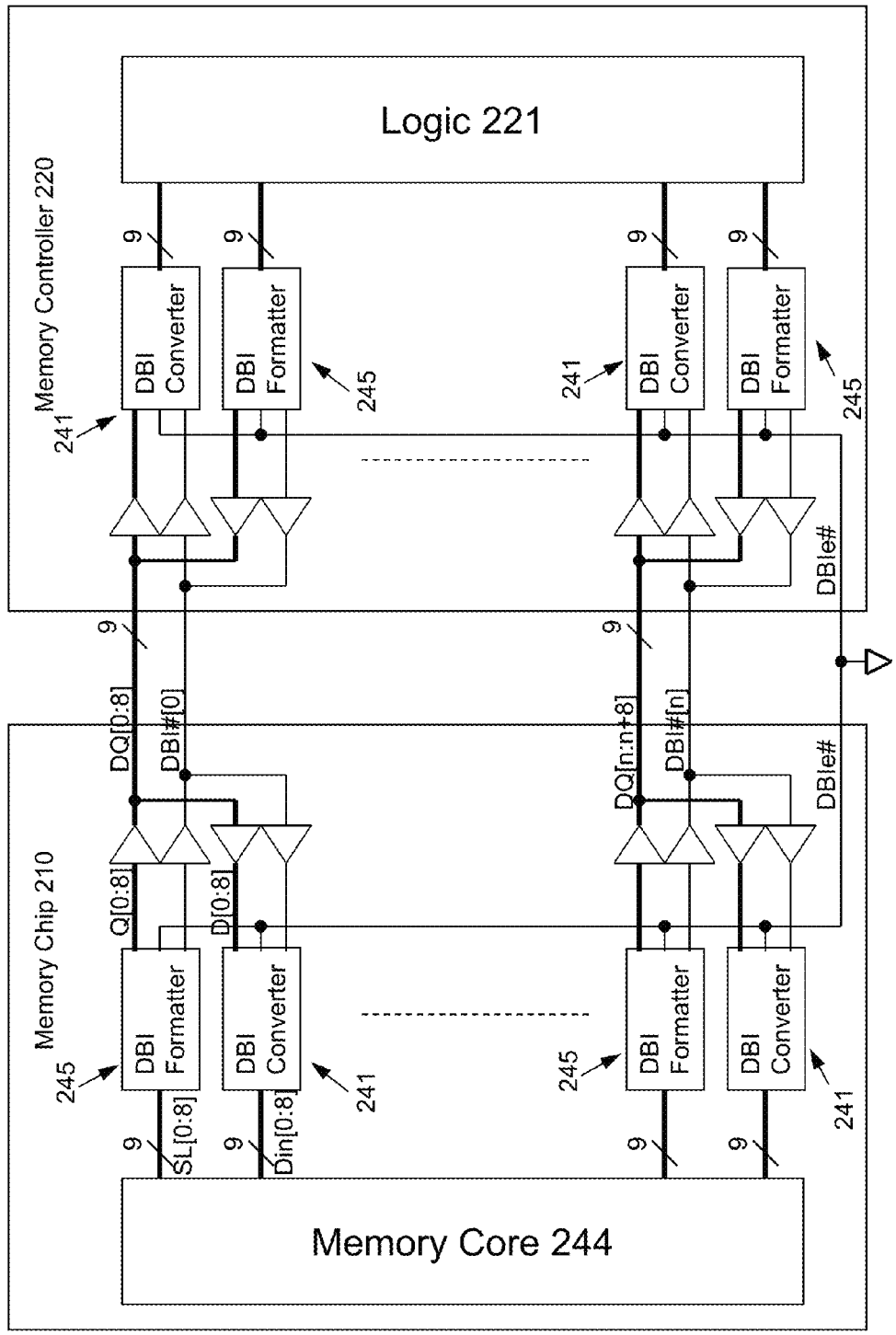
FIG. 2 Memory System with DBI
PRIOR ART

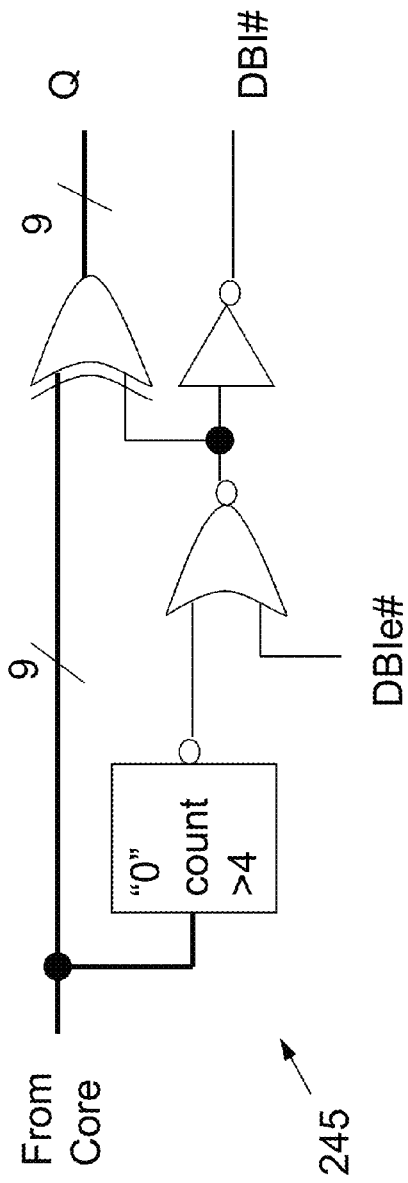
FIG. 3A DBI Formatter: Convert Bus to DBI Format
PRIOR ART
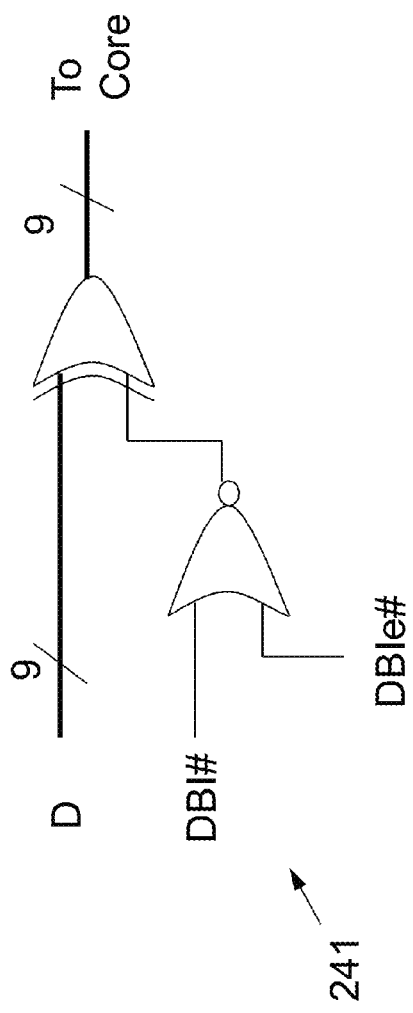
FIG. 3B DBI Converter: Convert DBI Bus to Conventional Bus
PRIOR ART

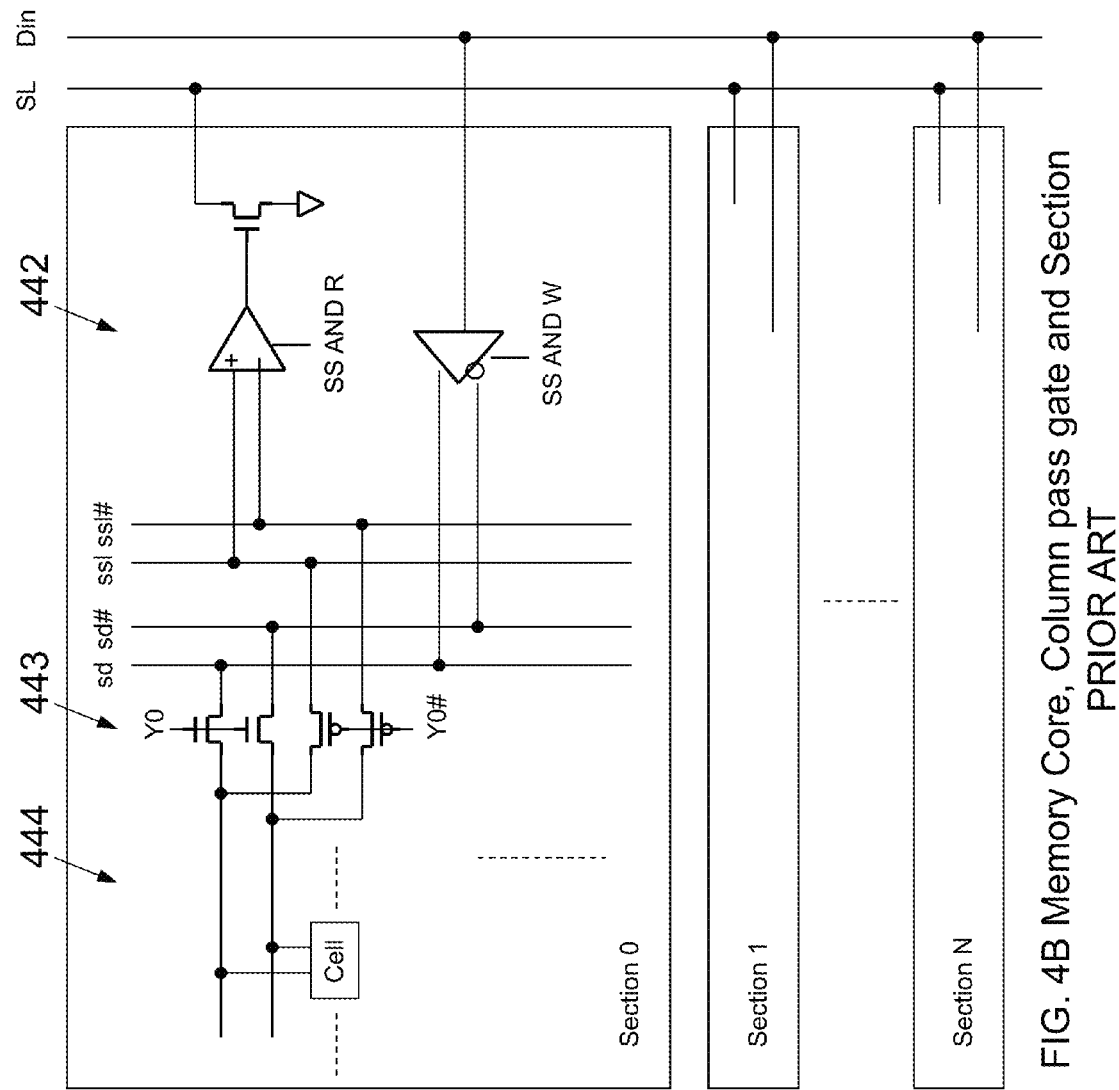
FIG. 4B Memory Core, Column pass gate and Section
PRIOR ART

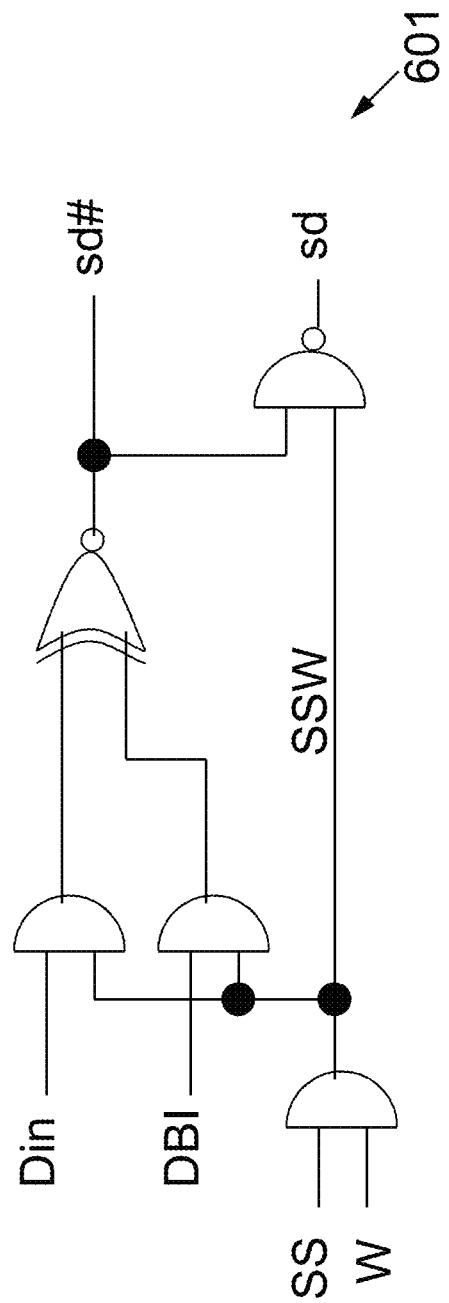
FIG. 6B Example of DBI Converter at Section

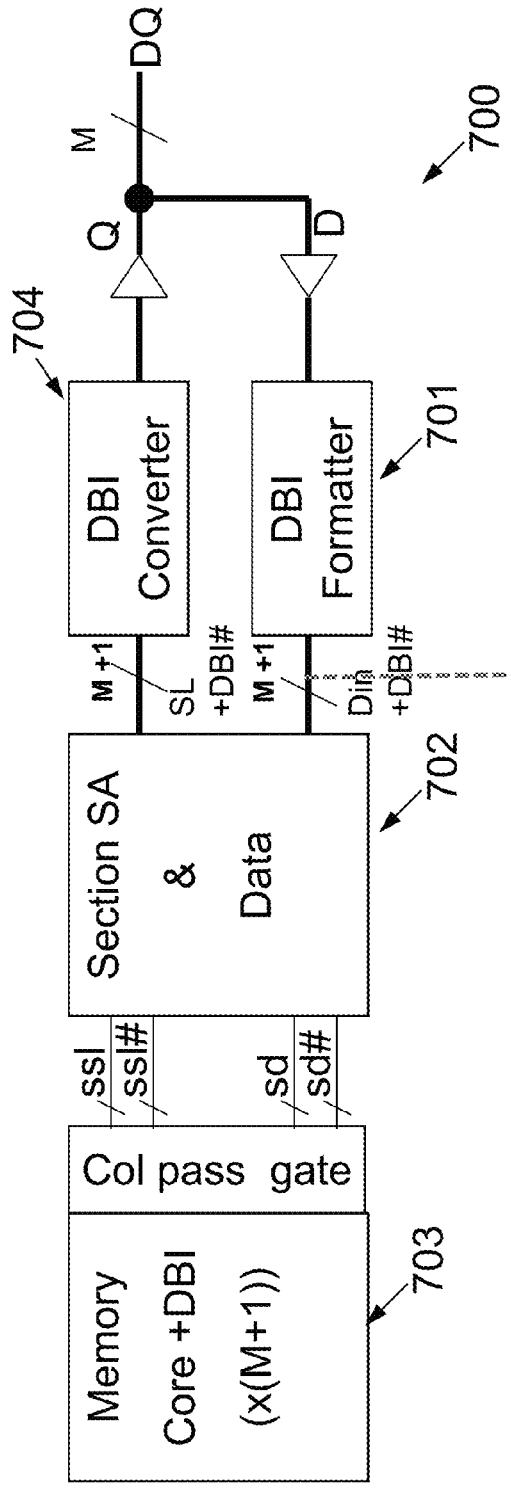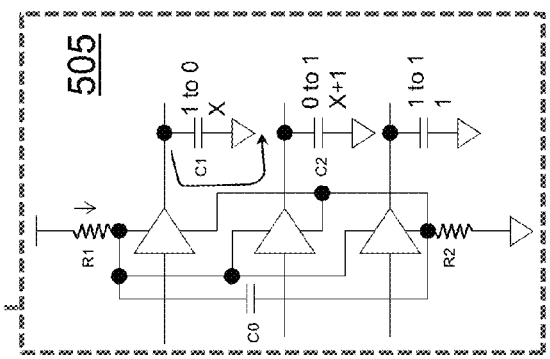
FIG. 7A

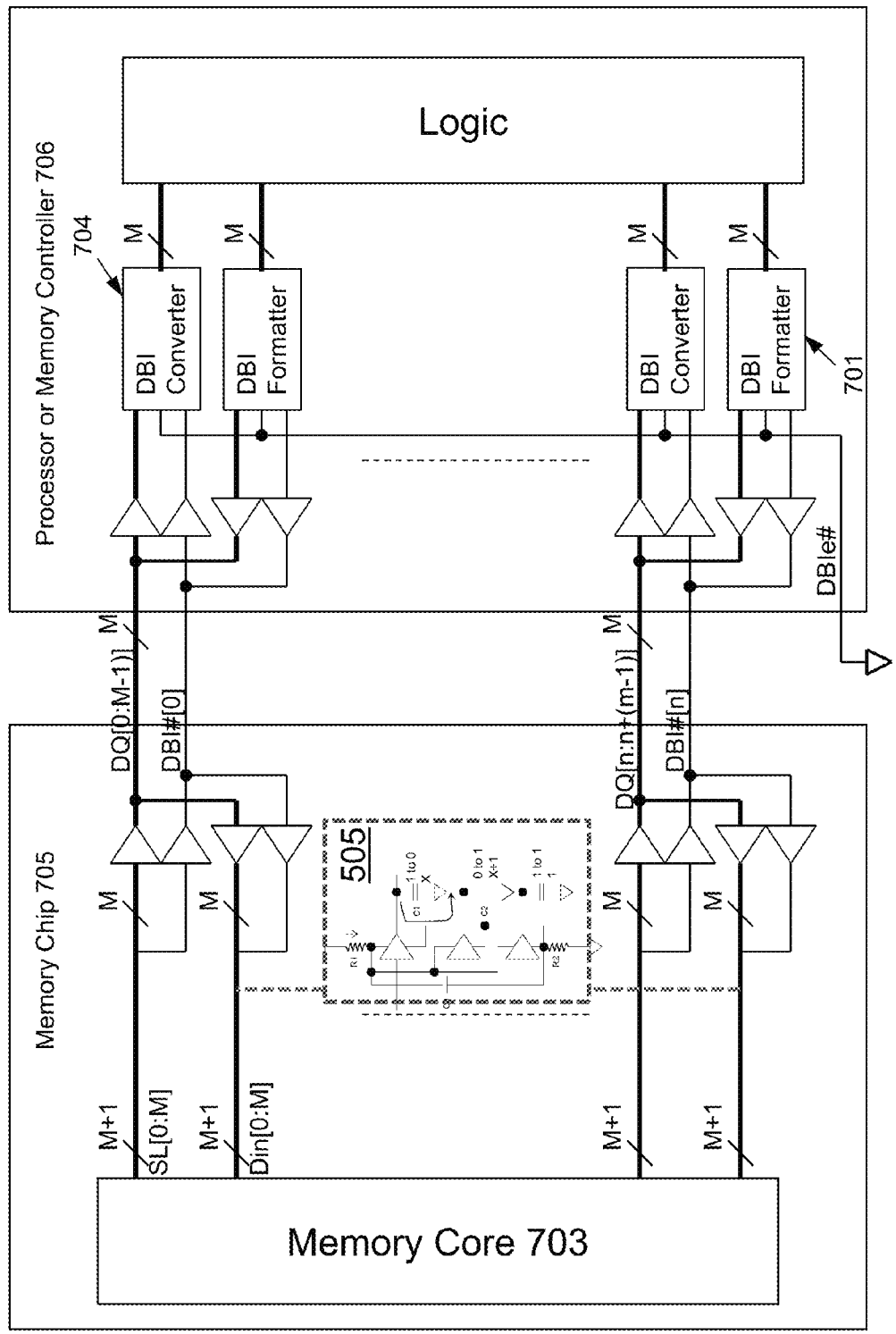
FIG. 7B Memory System with DBI stored in Memory

SYSTEMS AND METHODS INVOLVING DATA BUS INVERSION MEMORY CIRCUITRY, CONFIGURATION AND/OR OPERATION

CROSS-REFERENCE TO RELATED APPLICATION INFORMATION

This application claims benefit of/priority to provisional patent application No. 61/800,844, filed Mar. 15, 2013, which is incorporated herein by reference in entirety.

BACKGROUND

1. Field

The present innovations relate generally to data bus inversion, and, more specifically, to systems and method involving data bus inversion associated with memory configuration and/or operation.

2. Description of Related Information

Data bus inversion (DBI) is an interface scheme capable of reducing simultaneous switching noise, IO AC current and IO DC current drain and associated problems. According to DBI schemes, for example, when half or more I/O pins are low (i.e. 0) in the binary bus, a DBI pin named DBI# for signaling the data bus inversion is set to low (i.e. 0) and the data bus is inverted in the DBI bus. DBI# set to zero indicates an inverted data bus, where half or more bits in the DBI bus are high. Inversion may be performed on the data bits by DBI logic circuitry based on the DBI pin. Since no more than half of the bits can switch under the DBI scheme, then no more than half of the I/O lines consume AC power. The output in the DBI scheme is normally set to be terminated to high level through resistive connection to VDD supply. I/O DC current due to output termination is also reduced because no more than half of the outputs can be at low level.

FIG. 1 illustrates current switching of an internal M bit data bus. The maximum current switching is performed when all M bits switch from low to high in one cycle and from high to low the next cycle. When all M bits switch in the same direction, IDD and ground current are at a maximum level and therefore cause a current spike, which in turn causes VDD to drop and causes ground bounce through the power bus resistors R1 and R2. This, in turn, reduces the switching speed. So, although an external data bus adopts a DBI scheme to reduce DC and AC current and SSO (Simultaneously Switching Output) noise, the conventional design converts the external data bus to the normal data bus that is still noisy, e.g., with all bits switching.

An example of a conventional memory system incorporating DBI logic is provided in FIG. 2. Here, both DBI formatter circuitry 245 and DBI converter circuitry 241 are provided at each of the inputs and outputs of the memory core 244 of the memory chip 210. Likewise, the corresponding outputs and inputs of the memory controller 220 includes both the DBI formatter circuitry 245 and DBI converter circuitry 241. In this manner, DBI processing is performed between logic 221 and memory 244. The data stored in memory 244 does not include any DBI information. Conventionally, DBI converter circuitry 241 or DBI formatter circuitry 245 is provided in the memory controller 220 and paired with a corresponding DBI formatter circuitry 245 or DBI converter circuitry 241 within the memory chip 210.

Other existing DBI logic circuitry is provided in FIGS. 3A and 3B which illustrate DBI formatter logic and DBI converter logic, respectively. The DBI formatter logic of FIG. 3A receives inputs of nine data bits provided from a memory core and a DBI mode enabling signal DBIe#, and outputs the data bits with a one bit DBI pin DBI# indicating data inversion or non-inversion based on a quantity of the low data bits. DBIe# signal can be supplied from the external pin or from an internal mode register. The DBI converter logic of FIG. 3B receives inputs of nine data bits with the DBI pin DBI# and DBIe#, and outputs the data bits being inverted, or not, as a function of DBI# and DBIe#.

FIG. 4A illustrates one such conventional circuit design 440 implementing DBI logic. During a write cycle, for example, nine bit data DQ and one bit DBI pin DBI# is received and is processed through DBI converter logic 441 and outputted as a signal Din that is inverted if the DBI# is set to low. The data bits are then processed through Section Data 442 and outputted as section data sd, input to column pass gate 443, and then written into the memory core 444. During a read cycle, the stored M bit core data is processed through the column pass gate 443 and outputted as ssl, sensed in the Section circuitry 442 and outputted on the sense line SL. The DBI formatter logic 445 then outputs a DBI pin DBI# and the M bit data DQ. Further, FIG. 4B is a diagram illustrating exemplary circuit components of the memory core 444, column pass gate 443 and section circuitry 442.

Such conventional systems and methods, however, possess certain drawbacks and/or inefficiencies in processing the DBI bit and associated data into and out of the memory cell. These deficiencies lead to various issues, such as unnecessary power consumption, and/or as undesired current fluctuations and noise, among other drawbacks. As such, there is a need for systems and methods that may provide advantageous reduction of simultaneous switching noise, reduction of IDD current and/or IDD current spike issues, and/or removal of delay(s) due to DBI conversion, among other innovations.

DESCRIPTION OF THE DRAWINGS

The accompanying drawings, which constitute a part of this specification, illustrate various implementations and aspects of the innovations herein and, together with the description, help illustrate the principles of the present inventions. In the drawings:

FIG. 2 is a block diagram of an existing memory circuit incorporating DBI.

FIG. 3A is a schematic diagram of existing DBI formatter logic.

FIG. 3B is a schematic diagram of existing DBI converter logic.

FIG. 4B is a circuit diagram of an existing DBI circuit.

FIG. 6B is a schematic diagram of illustrative DBI converter logic as described in connection with the example of FIG. 6A, consistent with one or more aspects of the innovations herein.

FIG. 7A is a block diagram of illustrative circuitry and features of generating and storing DBI bits in exemplary memory devices, consistent with one or more aspects of the innovations herein.

FIG. 7B is a block diagram of illustrative circuitry and features of generating and storing DBI bits in exemplary memory systems consistent with one or more aspects of the innovations herein.

DETAILED DESCRIPTION OF ILLUSTRATIVE IMPLEMENTATIONS

Reference will now be made in detail to the inventions herein, examples of which are illustrated in the accompanying drawings. The implementations set forth in the following description do not represent all implementations consistent with the claimed inventions. Instead, they are merely some examples consistent with certain aspects related to the present innovations. Wherever possible, the same reference numbers will be used throughout the drawings to refer to the same or like parts.

FIGS. 5A through 11 describe various illustrative circuitry and features to implement various internal Data Bus DBI systems, methods and circuitry herein, though these drawings are representative and the inventions herein are not limited thereto.

Figure 5A:
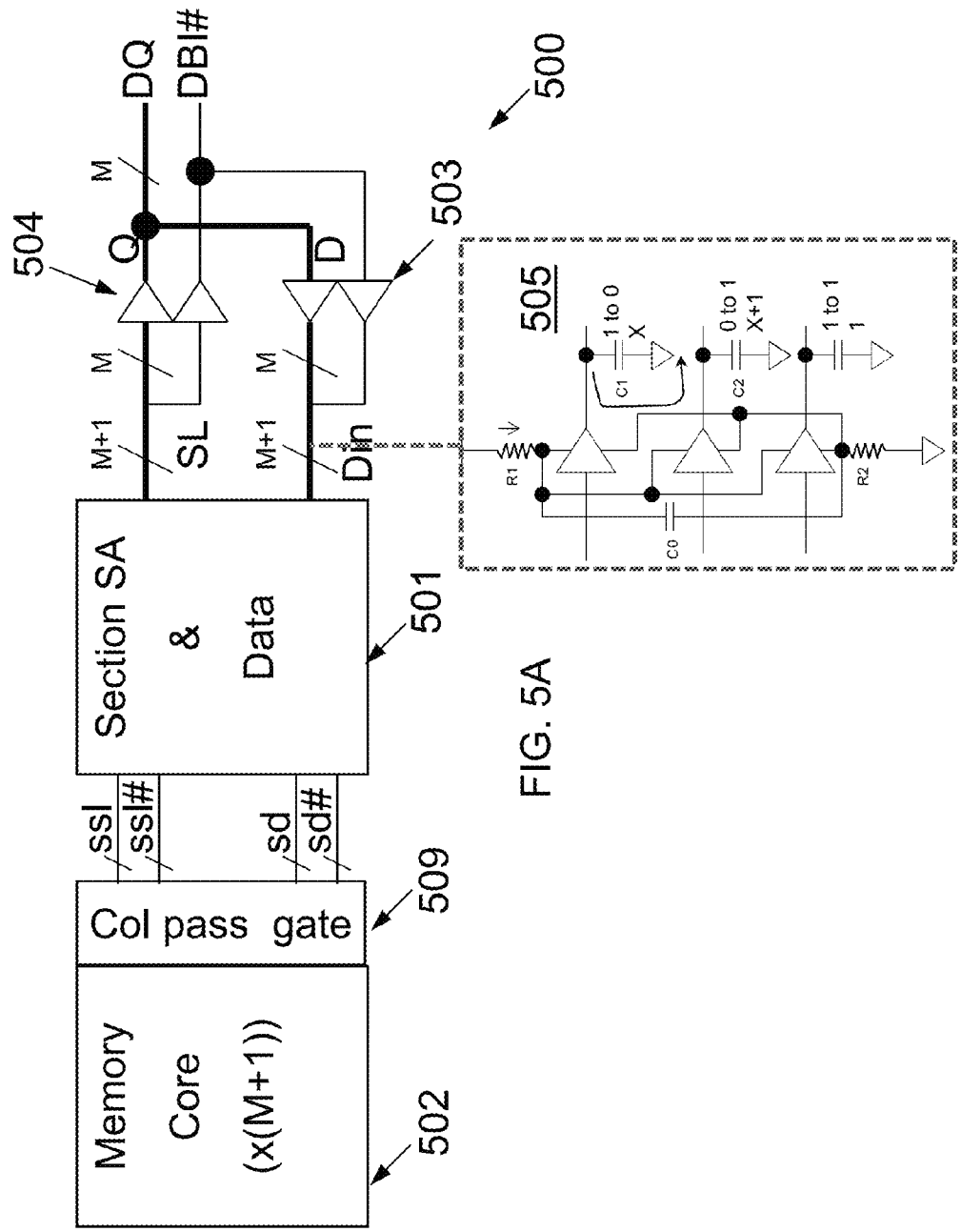
FIG. 5A is a block diagram showing illustrative data bus inversion aspects in an exemplary memory device consistent with one or more aspects of the innovations herein.

FIG. 5A is a block diagram showing illustrative data bus inversion aspects in an exemplary memory device consistent with one or more aspects of the innovations herein. Referring to FIG. 5A, a first aspect of the innovations of a memory device that receives a M bit data bus with DBI scheme and a DBI# input are illustrated. Here, the illustrative memory device 500 shown includes one or more sections with SA (Sense Amplifier) and Data driver 501 and a memory core 502. Implementations of such memory device may be decoded into sections to reduce the number of word lines and bit line length in order to achieve higher speed and consume less power.

As shown in FIG. 5A, the illustrative memory device 500 may include a memory core 502 and input circuitry 503 that receives a data bus inversion (DBI) bit associated with a data signal as input directly, i.e., without transmission through DBI logic associated with an input buffer. Further, memory circuitry such as section circuitry 501 may store the DBI bit into the memory core 502, read the DBI bit from the memory core 502, and provide the DBI bit as output. As such, according to implementations herein, a memory device such as memory device 500 may store and process the DBI bit on an internal data bus as a regular data bit.

Turning to exemplary operation of such circuitry, during one illustrative write cycle, M data bits and the one bit DBI# is received from pins, and passes through input buffers and drivers 503 to generate a M+1 bits Din bus. The input buffers and drivers 503 may contain input registers or latches for synchronous memory. In the M+1 bits Din bus, M data bits and the one bit DBI# are treated the same as a M+1 data bit memory device. The M+1 Din bits are then decoded in Section SA & Data 501 to generate M+1 sd (Section Data) and sd# (complementary sd) pairs. The sd and sd# pairs may then pass through a column pass gate 509 and then written into a M+1 data bit Memory Core 502.

Further, during one illustrative read cycle, the M+1 data bits from Memory Core 502 are accessed through the decoded section, where the signals pass through the column pass gate. Next, the signal are received by Section SA & Data 501 for sensing and amplification and then outputted as M+1 bits of SL (Sense Line) bus. In this illustrative implementation, the M+1 bits SL bus comprises M data bits and one DBI# bit. The SL bus is then buffered and driven by output buffer 504 as outputs. Further, output buffer 504 may contain output registers or latches for Synchronous memory. In such manner, memory devices herein may thereby be configured to store and process the DBI bit as a regular data bit. Accordingly, regular data bits are not converted through DBI converter logic on the write cycle and do not need to be converted by DBI formatter logic on the read cycle as set forth in FIG. 4A.

With respect to write operation, the Din bus may be a heavily loaded global line. As set forth herein, present implementations may have only (M+1)/2 data bits switching one way and the other bits switching the other way as a maximum number of bits switching. Therefore, switching noise is reduced compared to all M bits switching without including DBI# as part of the Din bus as done in existing circuitry. Switching noise is further reduced when all M+1 bits of the Din driver are grouped together to share a common decoupling capacitor from VDD to Ground due to the complementary switching nature (as shown and described in more detail below in connection with FIG. 5B). The reduced switching noise on VDD and Ground thus provide good power supply to speed up the Din bus. The write speed is also improved over the conventional art due to the absence of DBI converter logic. In addition, the AC current is reduced due to the complementary switching nature that 1 to 0 switching Din lines also contribute to charge up from 0 to 1 Din lines through the decoupling capacitor, an implementation of which is set forth, for example, in FIG. 5B.

Figure 5B:
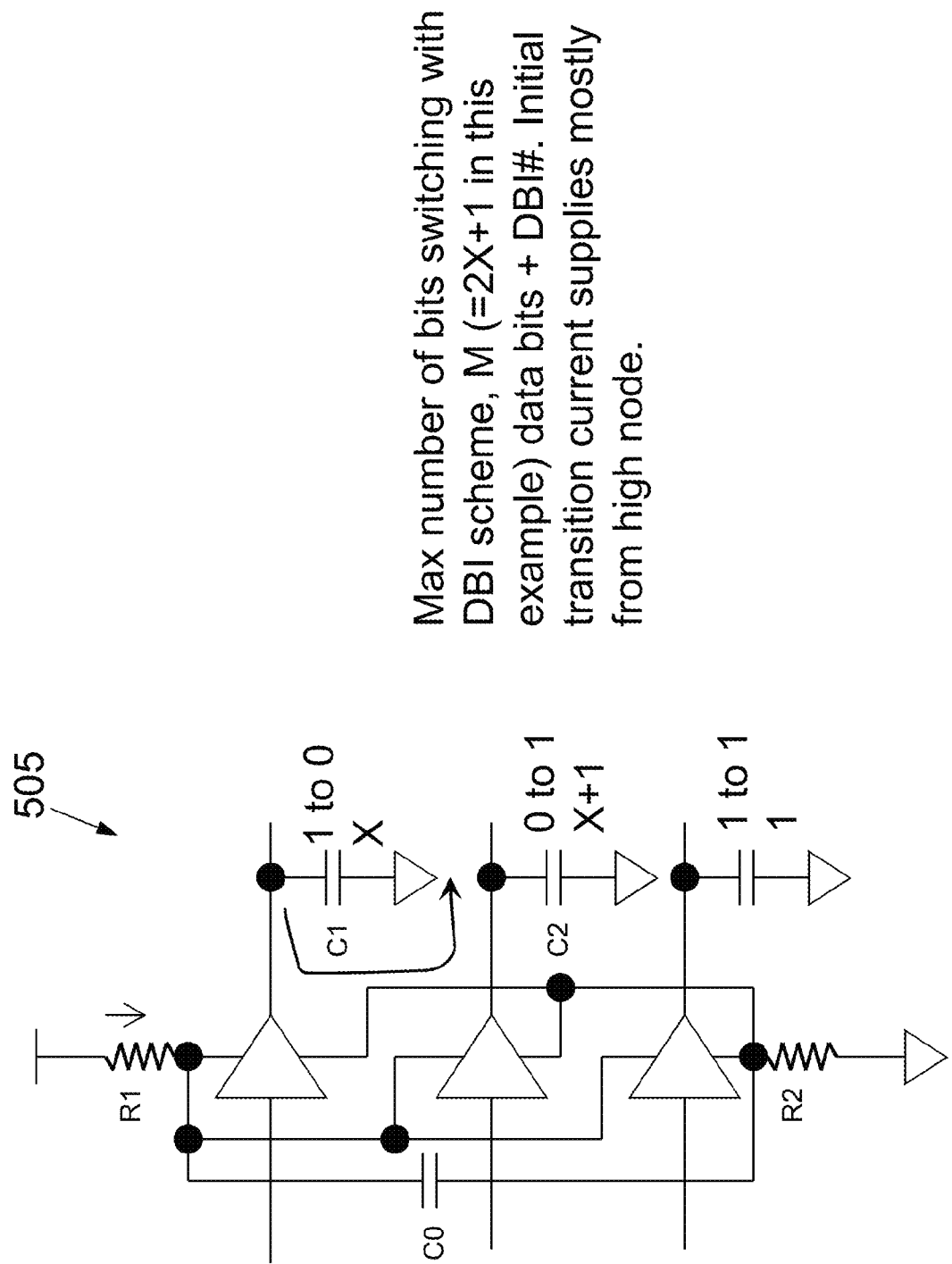
FIG. 5B is a circuit diagram of an illustrative switching circuit for data bus inversion schemes, consistent with one or more aspects of the innovations herein.

FIG. 5B is a circuit diagram of an illustrative switching circuit for data bus inversion schemes, consistent with one or more aspects of the innovations herein. As set forth in FIG. 5B, an example of a DBI scheme for an internal data bus with a M bit data pin and one bit DBI# is illustrated. Such illustrative circuit configuration may be utilized in other implementations, as shown and described elsewhere herein. Referring to FIG. 5B, a first state may be defined where DBI# is set to zero and the data has a combination of X low bits and X+1 high bits (e.g., data=00000000111111111 and DBI #=0). In a first state of such illustrative configuration, X bits from among the data and DBI# are set to low or pull down. Further, a second state may be defined where the DBI# is set to one and the data pin has a combination of X low bits and X+1 high bits (e.g., data=11111111100000000 and DBI #=1). In switching from the first state to the second state, X+1 bits from among the data bits and DBI# switch from 0 to 1 and X bits of data switch from 1 to 0. Next, in switching from the second state to the first state, X bits of data switch from 0 to 1 and X data bits and DBI# switch from 1 to 0.

As such, according to implementations herein, in switching from the first state to the second state or vice versa, the average number of bits switched from low to high is M/2, which is the same number as the maximum number of bit switches without DBI. However, the maximum number of bits switched occurs when there are (M−1)/2−(M+1)/2 bits switching from high to low with the other (M−1)/2−(M+1)/2 bits switching from low to high. This is referred to as complementary output switching where current spike induced switching noise can be mostly eliminated and AC power can be greatly reduced.

As set forth in connection with FIG. 5B, when the lump capacitance C1 loading of X data bits is discharging, the lump capacitance C2 of X+1 data bits charges at the same time such that the charges flow from C1 to C2 through decoupling capacitor C0. Part of the C2 charge required to reach a high level may be supplied from C1 through C0, thereby reducing the supply requirement from VDD and Ground. Here, then, such internal data bus DBI schemes may improve speed, reduce AC noise, and reduce AC power, in part, due to the complementary driving nature of these innovations.

Figure 1:
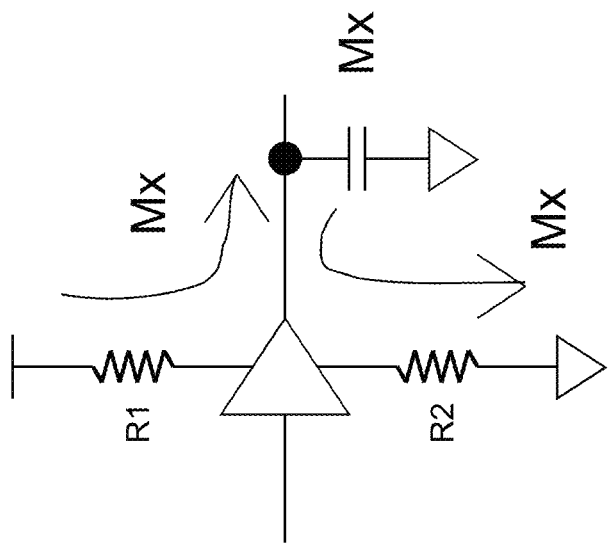
FIG. 1 is a circuit diagram of an existing switching circuit for a non-DBI scheme.
Figure 4A:
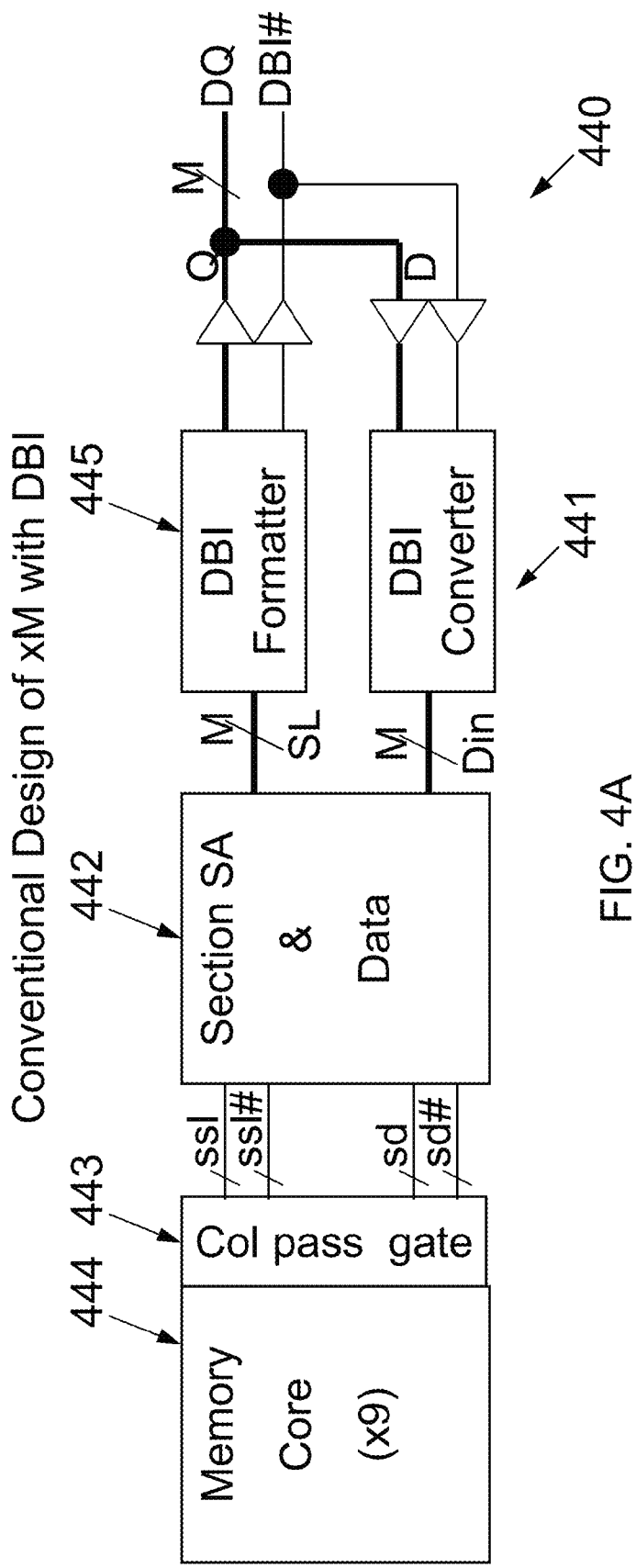
FIG. 4A is a block diagram of an existing DBI circuit.

Turning back to further operation consistent with the example of FIG. 5A, in the read operation, the SL bus may be a heavily loaded global line. Here, section SA receives a differential signal pair of ssl and ssl# and outputs a single ended SL. In one full utilization of the DBI scheme, the SL is pre-charged to 1 before SA operation. After sense, if the data is 1, then the SL will stay as 1; if the data is 0, the SL will switch to 0. Such implementations with DBI bit included SL have a maximum of (M+1)/2 bits switch from pre-charged state of 1 to final state of 0, while half of the M+1 data bits SL stay as 1. By contrast, all M bits of SL could switch from the pre-charged state to the final state in the prior art. Consequently, the reduced SL line switching reduces AC current and also reduces current switching noise and thus improves speed. The read operation speed is further improved with SL going straight to output without processing by any DBI formatter logic, as is required in existing systems such as shown in FIGS. 4A and 4B.

Compared to existing circuitry, innovations herein include one extra data bit to the M data bit memory core as chip size overhead. However, in order to achieve high speed, memory is often designed to comprise 8 or 16 banks, with each bank being further sectioned. The memory core efficiency is therefore less than 30% due to the banking overhead. The memory core efficiency is measured by the memory cell area divided by the chip area. So the 11% memory core overhead for, e.g., 9 data bit memory overhead with one extra data bit of the otherwise 9 bit memory core results in only 6.6% chip size penalty. Consistent with such information, present implementations may also provide a high bandwidth capability with wide I/O configurations. For example, x36 I/O with a burst length of four memory may be implemented into an internal x144 configuration.

Additionally, a x144 configuration may contain sixteen groups of x9 I/O with a DBI bit in each group, such that the memory core may be 160 bits wide. If there is one DBI bit for every eighteen I/O, then x144 IO configuration contains eight groups of x18 I/O with a DBI signal in each group, such that the memory core may be 152 bit wide.

According to implementations herein, a memory core may be coupled to a data bypass circuit including a write buffer storing addresses and comparator circuitry comparing a read address to the addresses stored in the write buffer. Data from the write buffer is retrieved instead of data from the memory array when, e.g., comparator circuitry determines that the address stored in the write buffer matches the read address.

Figure 6A:
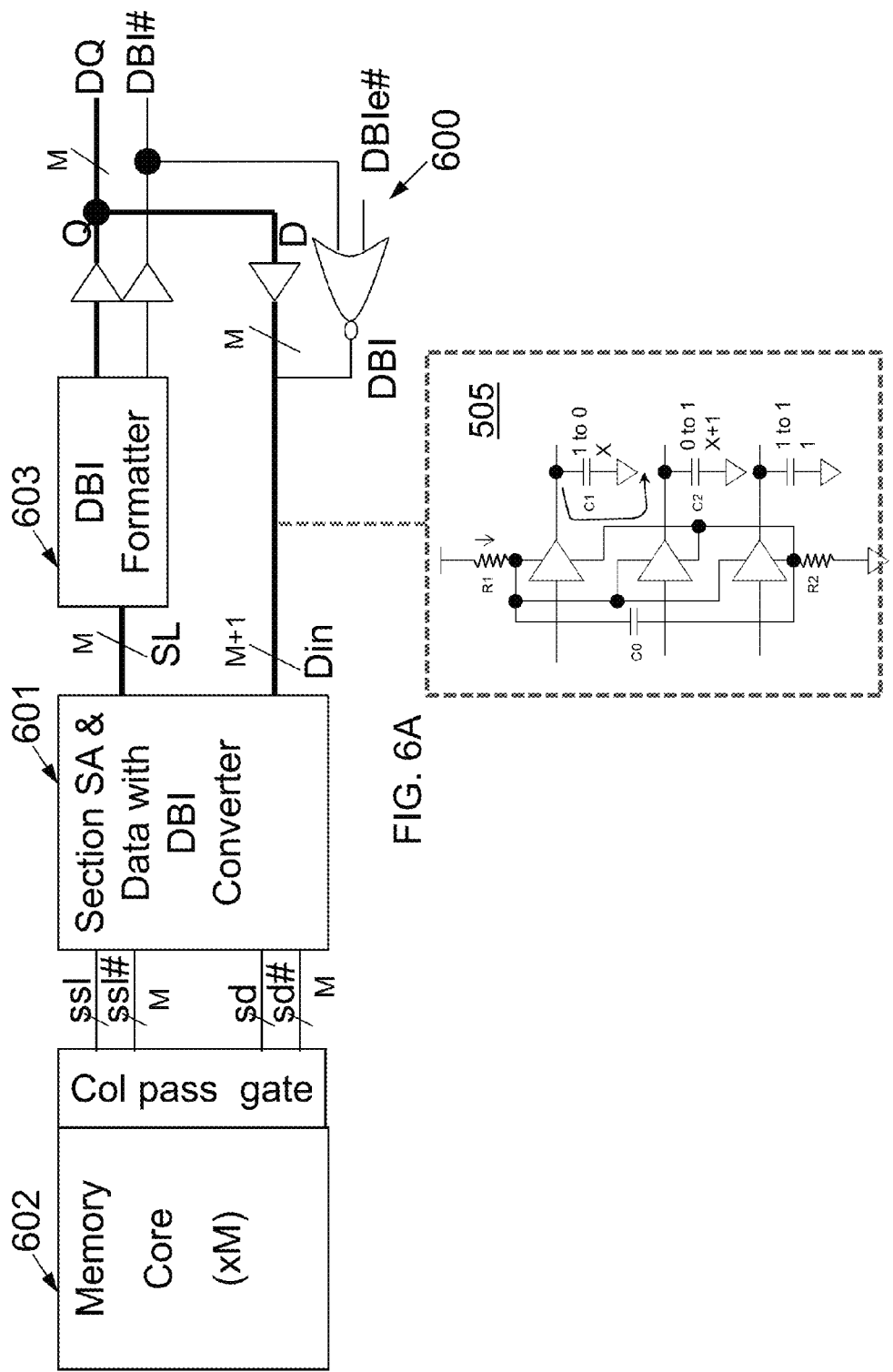
FIG. 6A is a block diagram showing illustrative DBI converter circuitry and features in exemplary memory devices, consistent with one or more aspects of the innovations herein.

FIG. 6A is a block diagram illustrating DBI converter circuitry and features in exemplary memory devices, consistent with one or more aspects of the innovations herein. Referring to FIG. 6A, additional features of generating and converting a DBI bit associated with a memory device 600 including a memory array 602 and Section SA & Data with DBI converter logic circuitry 601 having integrated DBI converter logic circuitry is disclosed. Additional aspects of such exemplary DBI converter logic circuitry are shown in more detail in FIG. 6B. The implementation of FIG. 6A may also include an output buffer 603 coupled to an output of the sense circuitry and configured to perform DBI formatter logic.

Here, for example, a memory device for memory operation utilizing data bus inversion may include a memory array 602 and local data writing circuitry coupled to the memory array, such as associated with section circuitry 601. A data bus inversion (DBI) bit and data bits are received as input. The local data writing circuitry may include a local data write driver and a local data bus inversion (DBI) converter circuitry/logic. The local DBI converter circuitry/logic, e.g. associated with section circuitry 601, converts DBI formatted data to non-DBI formatted data and the local data writing circuitry writes the non-DBI formatted data into bit lines of the memory array 602. Sense circuitry 601 coupled to the memory array reads out the non-DBI formatted data and outputs sense data. DBI formatter circuitry/logic 603 coupled to an output buffer of the sense circuitry formats the sense data into DBI formatted data and a DBI bit. An output buffer coupled to an output of the DBI formatter circuit may output the DBI bit and DBI formatted data.

Further, during one illustrative write cycle, the section data circuitry 601 may be configured to process data bits as well as an associated DBI bit, received together, where the DBI bit is input directly without transmission through DBI logic associated with an input buffer. DBI converter logic may be performed at Section Data circuitry 601 to convert and write the data into memory core 602. Here, for example, during a write cycle, data DQ and a DBI bit are input and form data bus Din, where the section data circuitry 601 then determines whether to invert or not invert the data DQ based on the DBI bit. The data bits are then converted into section data sd and stored into the memory core 602.

Further, during one illustrative read cycle, when the data is read from the memory core 602 by the section SA 601, the DBI formatter logic 603 reads the data bits output from the sense circuit 601 on the sense line and generates a DBI bit DBI# and inverts the SL if the number of 0 bit is (M+1)/2 or more. The operation of DBI formatter logic 603 may be similar to the operation as seen elsewhere herein.

FIG. 6B is a schematic diagram of illustrative DBI converter logic as described in connection with FIG. 6A, consistent with one or more aspects of the innovations herein. In the illustrative circuit, for example, the write and SS signals are ANDed together, with the output SSW being ANDed with both Din and DBI. SS is the section select signal generated by the section decoder circuitry. These two outputs are then XNOR'd together to yield inverted section data signal sd#, with sd# also being NANDed with SSW to yield section data sd. Utilization of such DBI converter logic within the section data circuitry reduces much of the switching noise of a DBI formatted, heavily loaded global Din bus. The switching current of Din bus is also reduced as described in FIG. 5B. Hence, power consumption is reduced and higher speed is achieved with lower switching noises.

In the illustrative implementations shown in FIGS. 6A-6B, there is no extra DBI bit stored in the memory core, so the chip size is smaller than that of FIG. 5A, and it provides the benefit of lower power consumption, reduced noise and higher speed in the write cycle with the same chip size compared to existing systems, such as the ones shown and described in FIG. 4.

FIG. 7A is a block diagram illustrating features of generating and storing DBI bits in exemplary memory devices, consistent with one or more aspects of the innovations herein. Referring to FIG. 7A, a memory device 700 including a memory array 703, section SA & data circuitry 702, DBI formatter logic 701 at an input of the sense circuitry 702, and DBI converter logic 704 at an output of the sense circuit 702 is disclosed.

According to the exemplary implementation of FIG. 7A, an illustrative memory device 700 may include a memory array 703 and sense circuitry 702 coupled to the memory array 703, where the sense circuitry 703 includes a sense amplifier and an internal bus including a data bus inversion (DBI) signal. Here, for example, the sense circuitry 702 stores the data bits and DBI bits into the memory array 703, reads the DBI bit from the memory array 703, and provides the DBI bit as output to an output buffer 704. The output buffer 704 includes DBI converter circuitry/logic. An input buffer 701 includes DBI formatter circuitry coupled to the sense circuitry 702 and performing DBI formatter logic. The memory device 700 stores and processes the DBI bit as a regular data bit into the memory array and on an internal data bus such that the data input and output to the memory device are in a non-DBI format.

Further, during one illustrative write cycle, input data is provided to the DBI formatter logic 701 where a DBI bit is generated. The memory device and section SA & data circuitry 702 may also include an internal bus for a DBI signal, to process DBI bits as data bits through the memory device and into the memory array 703. DBI formatter logic 701 may take the form of the circuitry described in FIG. 3A with DBIe#=0 taking the M data bits from D input pins and generating a DBI bit and also converting the M data bits to the DBI format, i.e., M data bits are inverted if (M+1)/2 or more bits are 0. Further, in some implementations, the DBI converter logic 704 may also include circuitry, such as described elsewhere herein, with DBIe#=0 taking DBI formatted M bit SL lines and a DBI bit as inputs and converting to M data bits without the DBI format and coupled to Q output pins.

Accordingly, the memory device 700 may be configured to receive non-DBI formatted data bits, convert the data format to DBI and generate a DBI bit, store the DBI bit along with data bits into the memory core 703, read out the DBI bit along with DBI formatted SL, and convert SL to non-DBI format data output DQ. In sum, the memory system 700 may receive and output non-DBI formatted external data, but internally, the data bus is converted to DBI format in the same manner as a M+1 bit Din bus and M+1 bit SL bus of FIG. 5A, thus achieving reduced power consumption and noise while improving speed.

The present inventions may also be used within a memory system. For example, the implementation of FIG. 7A can be extended to a memory system that contains a host chip (i.e., a processor or a memory controller) to interface with at least one memory chip. One implementation is described with respect to FIG. 7B.

FIG. 7B is a block diagram for generating and storing DBI bits in exemplary memory systems consistent with one or more aspects of the innovations herein.

FIG. 7B illustrates a memory system including a memory chip 705 and memory controller 706. The memory chip 705 can be a multiple of memory chips. The memory chip 705 includes a memory core 703 for storing data. Controller 706 includes a DBI converter 704 and DBI formatter 701 for input and output. The controller 706 outputs the M bit data and the one bit DBI bit for the memory chip 705. The memory chip 705 processes the DBI bit as a data bit for storage into the memory core 703. DBI formatter logic 701 may take the form of various circuitry taking the M data bits as inputs generating a DBI bit and also converting the M data bits to the DBI format, i.e., M data bits are inverted if (M+1)/2 or more bits are 0. Further, in some implementations, the DBI converter logic 704 may include circuitry with DBIe#=0 taking DBI formatted M data bits and a DBI bit as inputs and converting to M data bits without the DBI format as outputs.

Accordingly, the memory system in FIG. 7B may be configured such that the Logic in Processor or Memory Controller 706 sends out non-DBI formatted data bits, data is then converted to DBI format, generates the DBI bit and send to memory chip. Memory chip 705 stores the DBI bit along with the data bits in memory core 703, and read out the DBI bit along with the DBI formatted SL and send out the DBI formatted data output to the Processor or Memory Controller 706. Finally, in the Processor or Memory Controller 706, the data received is converted to a non-DBI formatted input to the Logic. In this manner, in the memory system in FIG. 7B, only Processor or Memory Controller 706 performs the DBI data formatting and converting, the memory chip 705 receives, transmits and stores DBI formatted data, thus achieving reduced power consumption and noise while improving speed.

Figure 8:
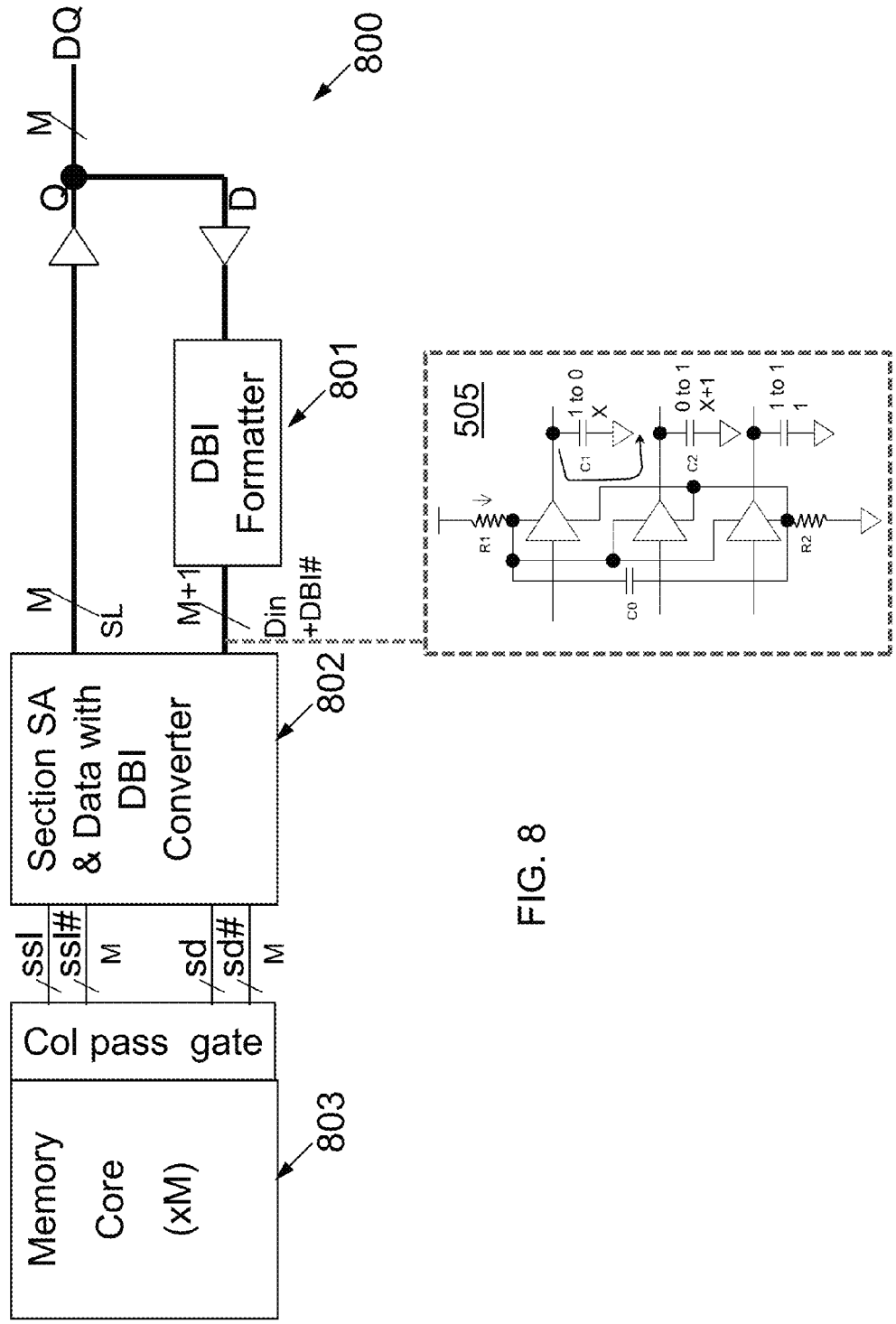
FIG. 8 is a block diagram of illustrative circuitry and features of generating DBI bits and performing write DBI logic at section in an exemplary memory device, consistent with one or more aspects of the innovations herein.

FIG. 8 is a block diagram illustrating features of generating DBI bits and performing DBI converter circuitry operation in exemplary memory devices, consistent with one or more aspects of the innovations herein. Referring to FIG. 8, another implementation of a memory device 800, shown here, may include Section Data circuitry 802 integrated with DBI converter logic, in a manner consonant to that discussed above with respect to FIG. 6A, is disclosed.

According to the exemplary implementation of FIG. 7A, a memory device 800 may include a memory array 803 and sense circuitry 802 coupled to the memory array 803, where the sense circuitry 802 includes a section sense amplifier, data bus inversion (DBI) converter circuitry, and an internal bus for a DBI signal. An input buffer is coupled to an input of the sense circuitry 802 and includes DBI formatter circuitry/logic 801. The sense circuitry 802 processes data bits and an associated DBI bit that are received together, performs DBI conversion, converts the data bits, writes the data bits onto bit lines, reads the data bits from the memory array, and provides the data bits as output.

Here, aspects of memory system 800 may be similar to the memory system 700 that receives and sends a non-DBI formatted data bus. Further, during an illustrative a write cycle, e.g. similar to DBI formatter logic 701, DBI formatter logic 801 receives input data and generates a DBI bit and DBI formatted Din bus to send to Section SA & Data with DBI converter logic 802. Unlike memory system 700, memory system 800 does not store the DBI bit into the memory core 803. However, like memory core 600, memory system 800 converts the DBI formatted Din bus and DBI bit into a sd and sd# pair through Section SA & Data with DBI converter logic 802 in the same way as DBI converter logic 601 does. Further, during one illustrative read cycle, due to the data being in a non-DBI format, the read operation is a conventional read operation and no DBI conversion is required.

In such manner, the illustrative memory system 800 may receive and output non DBI formatted external data, but internally, the data bus is converted to a DBI format during a write cycle, same as the M+1 bit Din bus described by FIG. 7A. Thus, power consumption and noise are reduced with an improvement in speed for the write cycle. The memory system 800 also does not incur the M+1 bit memory core overhead penalty and has the same chip size as a non-DBI memory chip.

Figure 9:
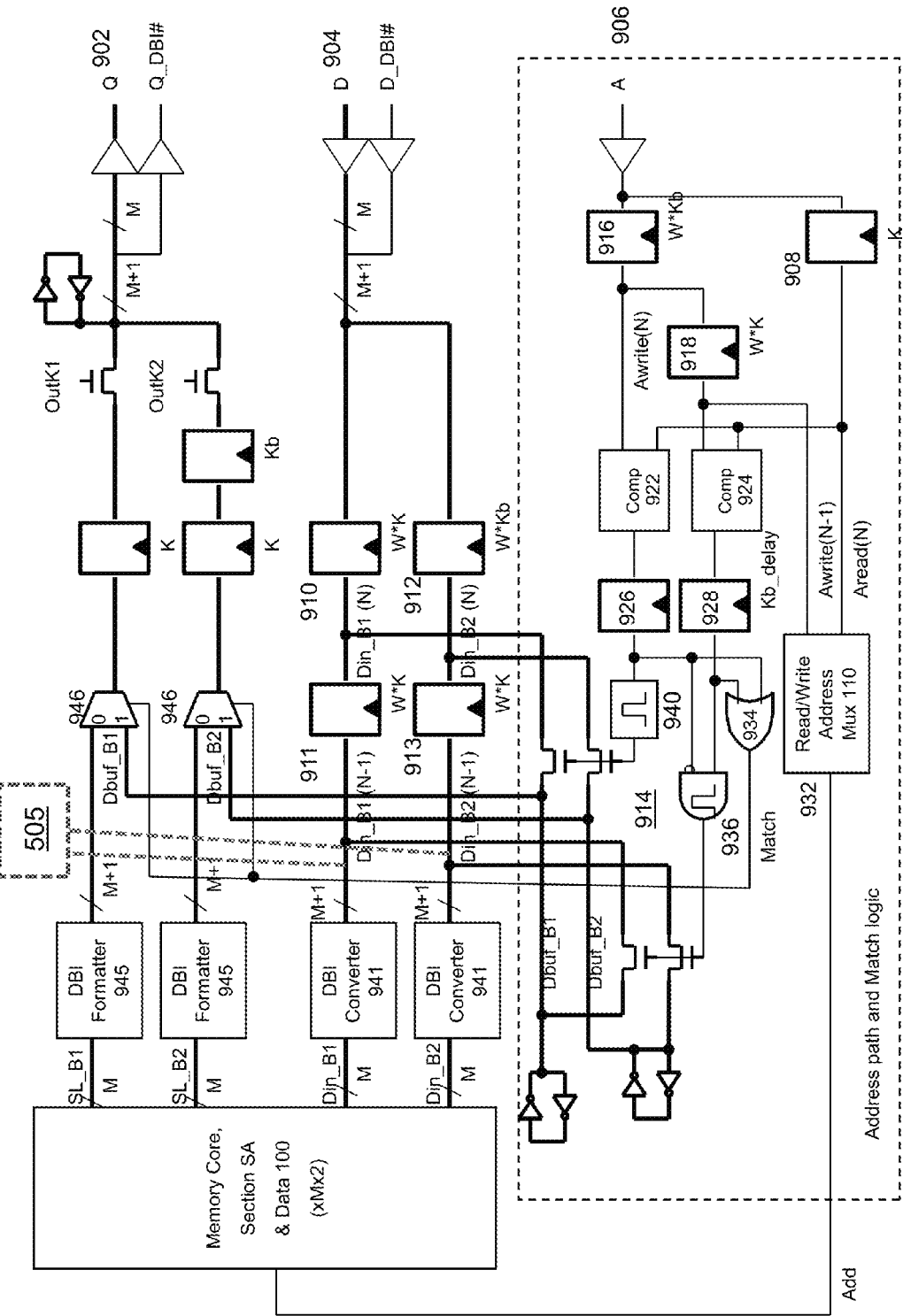
FIG. 9 is a block diagram depicting exemplary circuitry including an illustrative data bypass implementation with a DBI scheme consistent with one or more aspects of the innovations herein.

FIG. 9 is a block diagram depicting exemplary circuit showing an illustrative data bypass implementation with DBI scheme, consistent with one or more aspects of the innovations herein. The data bypass scheme described herein may be advantageously implemented with various of the DBI memory schemes discussed above as well as other schemes within the ambit of the inventions herein. A DDR (Double Data Rate) output Q 902, DDR data input D 904 and DDR address input A 906 are provided. The address input A 906 sends the Read address in the K ($1^{st}$) clock edge of a clock cycle and send the write address in the Kb ($2^{nd}$, complementary of K) clock edge of the same clock cycle. In the meantime, the Read address is stored in the chip as Aread(N) at a register 908 clocked by K. Aread(N) then passes through the Read/Write Address Mux 110 and memory core 100 to access the data. Memory core with data width of 2*M bits and Section SA 100 then send out M bits wide of SL_B1 and SL_B2 as outputs. In particular, SL_B1 is the first beat of output and SL_B2 is the second beat of the output and are outputted from Memory array at the same time. Each output SL_B1 and SL_B2 pass through a respective data Mux and output registers where outK1 and outK2 clock alignment signals multiplex these 2 paths into a single path as output Q of M bits wide.

Data input D 904 of M bits wide inputs two beats of DDR data inputs on the K and Kb clock edges corresponding to the write address on the same clock cycle. The signals used to strobe in Data input D are called W*K and W*Kb to represent the pulse generated from the combined function of the registered Write signal and clock edges of K and Kb. The first beat of DDR D is stored in a register 910 clocked by W*K as Din_B1(N) and the second beat of DDR D is stored in a register 912 clocked by W*Kb as Din_B2(N). Both Din_B1 (N) and Din_B2(N) are then stored in the next registers 911 and 913 clocked by W*K as Din_B1(N−1) and Din_B2 (N−1). The Write address is stored into the chip by a register clocked by W*Kb as Awrite(N). Awrite(N) is then stored on the next cycle by a register clocked by W*K as Awrite(N−1). After the Aread(N) read operation is finished, Awrite(N−1) then goes through the Read/Write Address Mux 110 and send the write address to the Memory Core 100 for the write operation of 2*M bits with data of Din_B1(N−1) and Din_B2 (N−1).

It is noted that various storage elements herein are referred to as 'registers' for the sake of discussion herein. However, such storage elements, such as the registers in the address path, D path and Q path may be other types of storage or switching elements, such as latches, etc. In other words, reference to registers is done for the ease of discussion, but is not otherwise limiting.

In this memory operation, a write buffer includes the write address Awrite(N) with the corresponding data Din_B1(N) and Din_B2(N), and another write address Awrite(N−1) with the corresponding data Din_B1(N−1) and Din_B2(N−1) is stored outside of the Memory Core 100. These two data in the write buffer are more updated compared to the data stored in the same address in the Memory Core 100. The address path and match logic 914 performs the comparison logic to compare the input read address against the write addresses stored in the write buffer. Comparator 922 and 924 compare Aread (N) to Awrite(N) and Awrite(N−1), respectively. When Aread (N) is same as Awrite(N) or Awrite(N−1), then the output of Comparator 922 or 924 is 1, otherwise, the output of 922 or 924 is 0. The outputs of Comparator 922 and 924 are then stored by registers 926 and 928, respectively. The clock used for 926 and 928 is Kb_delay, a delay clock from Kb so it can have the correct timing to account for the delay from register 916 (at the timing of W*Kb) to Comparator output 922 to capture both the Comparator output 922 and 924 in the same cycle. The output of registers 926 and 928 are "ORed" by gate 934 to generate signal Match. This means that if Aread(N) is same as either Awrite(N−1) or Awrite(N), or both, then Match is 1. The signal Match is routed to the output path to control the output Mux 946. If Match is 0, then the Mux 946 takes the data from memory core 100 to send to the output pin Q; If Match is 1, then the Mux 946 takes the data from D input path through Match logic 914. Reference numbers 940 and 936 correspond to one shot generators to convert the output of 926 and 928, respectively, from data 1 to a one shot pulse. One shot pulse generators 940 and 936 control the passing of data Din_B1(N)/Din_B2(N) and Din_B1(N−1)/Din_B2(N−1) to Dbuf_B1/Dbuf_B2, respectively. Dbuf_B1 and Dbuf_B2 have their own latches to maintain the values when the outputs of one shot pulse generator 940 and 936 controlled pass gates are off. This means that if Aread(N) is the same as Awrite(N) or Awrite (N−1), then the output Q will take the data from data input path Din_B1(N)/Din_B2(N) and Din_B1(N−1)/Din_B2(N−1), respectively, instead of data from the memory core 100. However, if Aread(N) is same as both Awrite(N) and Awrite(N−1), then because Awrite (N) is newer then Awrite(N−1), and therefore has higher priority, Dbuf_B1/Dbuf_B2 takes the data from Din_B1(N)/Din_B2 (N) over Din_B1(N−1)/Din_B2(N−1) and then passes that data to the output path. One shot pulse generator 936 has the priority logic that Awrite(N) register 926 output blocks out Awrite(N−1) register 928 output that whenever one shot pulse generator 940 generates a one shot pulse, one shot pulse generator 936 will not generate the one shot pulse.

As such, when the input read address is the same as the two addresses in the write buffer, the data output Q retrieves the data from the registers of the write buffer rather than from the Memory Core 100, with respect to which DBI conversion occurs via DBI formatters 945 and DBI converters 941. When the comparison is true, the match signal is set high to multiplex the data from write buffer (Dbuf_B1, Dbuf_B2) into the output path associated with the output Q 902.

Referring to FIG. 9, an illustration of an implementation of DBI conversion and DBI formation in a memory with Write Buffer is shown. Here, for example, a memory core is coupled to a data bypass circuit including a write buffer storing addresses and a comparator comparing a read address to the addresses stored in the write buffer. Data from the write buffer is retrieved instead of data from the memory array when the comparator determines that the address stored in the write buffer matches the read address. For example, implementations consistent with the innovations herein may be configured with data registers 910-913 in the write buffer positioned between the D input pins and the DBI Converter(s) 401, as set forth herein. The data of the data register 910-913 may then be available to feed into the output path without passing through DBI Formatter 945, e.g., if the read address matches the write addresses in the write buffer. Such implementations may greatly speed up the data bypass logic to allow the data bypass in high frequency operation because DBI conversion and DBI formatting are not performed when the read address matches the write address in the write buffer.

Similarly, the schemes described in the FIG. 5 to FIG. 8 may be implemented consistent with the data bypass configurations and/or schemes described above to have data input registers between the D input pin and DBI converter (if present), and have an output Mux and registers between a DBI Formatter (if present) and Q output pin when the write buffer and bypass logic is included.

Figure 10:
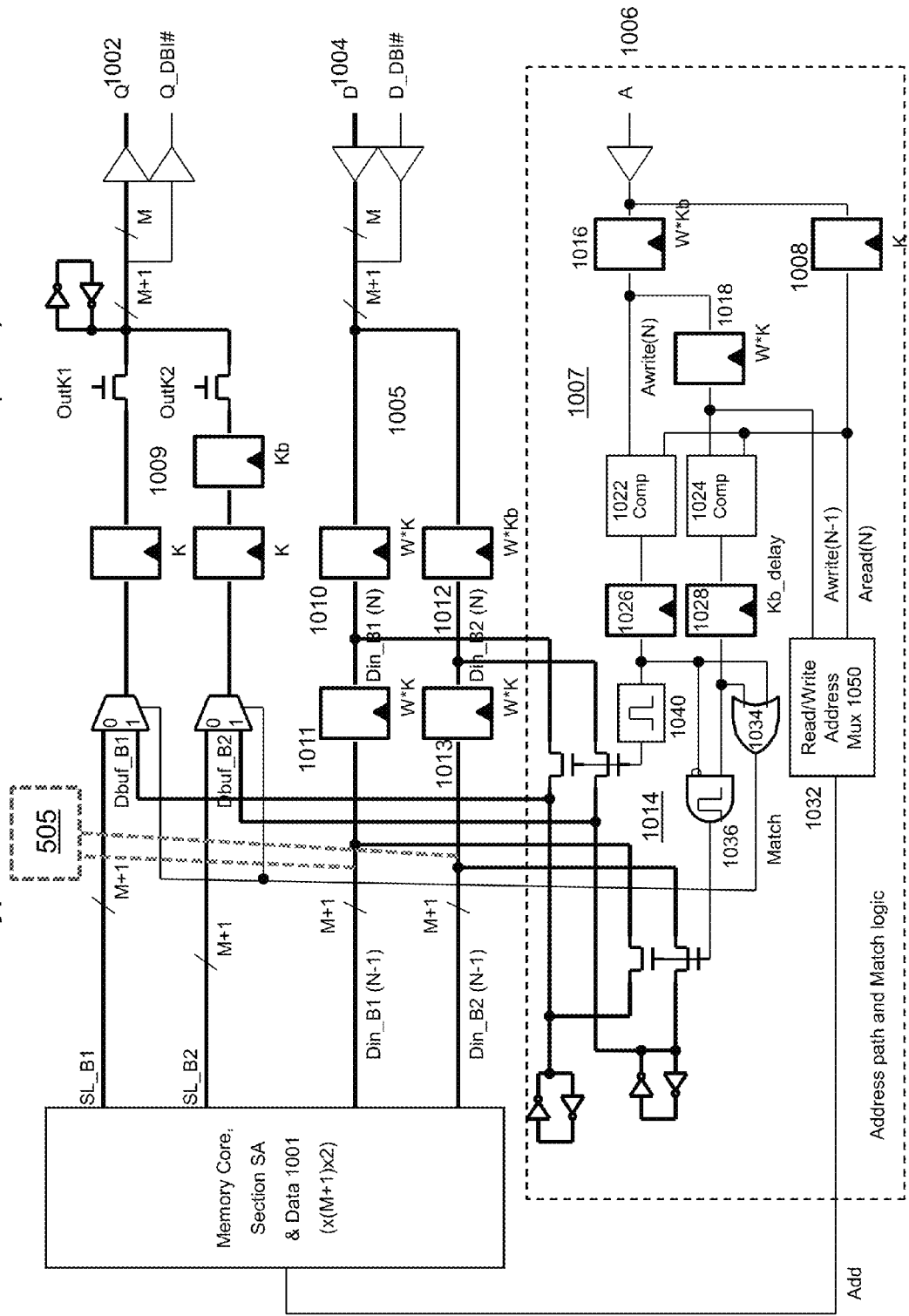
FIG. 10 is a block diagram depicting exemplary circuitry showing an illustrative data bypass implementation with DBI data stored in memory as a M+1 bit, consistent with one or more aspects of the innovations herein.

FIG. 10 is a block diagram depicting exemplary circuit showing an illustrative data bypass implementation with DBI data stored in memory as a M+1 bit, consistent with one or more aspects of the innovations herein. FIG. 10 illustrates the data bypass scheme applied to implementations such as FIG. 5 where DBI bit is stored in memory core as a data bit. Here, for example, a memory core may be coupled to a data bypass circuit including a write buffer storing addresses and a comparator comparing a read address to the addresses stored in the write buffer. Data from the write buffer is retrieved instead of data from the memory array when the comparator determines that the address stored in the write buffer matches the read address.

Turning to the address path and match logic 1014 of FIG. 10, this circuitry performs the comparison logic to compare the input read address against the write addresses stored in the write buffer. Here, a DDR (Double Data Rate) address input A 1006 is provided in conjunction with corresponding DDR data input D 1004 and DDR output Q 1002. In the illustrative circuitry shown, the address input A 1006 sends the Read address in the K ($1^{st}$) clock edge of a clock cycle and sends the write address in the Kb ($2^{nd}$, complementary of K) clock edge of the same clock cycle.

The address path and match logic 1014 may include a double data rate address bus 1007 comprise of registers/latches/circuitry that reads addresses at the rising edge of the clock and that writes addresses at the falling edge of the clock, or at the rising edge of the complementary clock. Here, for example, the DDR address bus 1007 may include a first register or latch (i.e. switch) 1008 that stores a read address by the rising edge of the clock, or by the rising edge of the clock containing read command information, as well as a second register or latch 1016 that stores a write address by the falling edge of the clock, or the rising edge of the complementary clock, containing write command information. Further, such DDR address bus 1007 may also include a third write address register or latch 1018 coupled to the second register 1016 and storing its output data via the rising edge of clock containing write command information. In some implementations, the DDR address bus 1007 may also include a read write address multiplexer 1010 connected to send the read address output from the first register 1008 and the write address output from the third register 1018 to memory core 1001 in a clock cycle. In some implementations, the match logic may include comparators 1022 and 1024. Comparator 1022 compares read address of register 1008 and write address of register 1016. The output of comparator 1022 is true (1) if these two addresses are equal, otherwise it is false (0). Similarly comparator 1024 compares read address of register 1008 and write address of register 1018. The outputs of comparator 1022 and 1024 are stored by registers or latches 1026 and 1028, respectively. If any of the latched comparator outputs is true, then the match signal Match may be generated by OR gate 1034. Signal Match is sent to an output path to multiplex the data from the data input path to the data output path, bypassing the data from the Memory Core 1001. The data from the data input path is connected to the output path through the latches controlled by pulse generator 1040 and 1036. Pulse generators 1040 and 1036 may sample the register outputs 1026, 1028 respectively, and generate a shot pulse to pass the data from the data input path to the output path. If both comparator registers 1026 and 1028 are true, then the output of 1026 has higher priority because its comparing write address from register 1016 as the latest.

In illustrative operation, the memory of FIG. 10 and the circuitry of the read write address multiplexer 1010 may be configured to send read address to the memory core controlled by a self-timed read pulse for read operation(s), then, after completion of the self-timed read pulse, send write address(es) to the memory core controlled by a self-timed write pulse for write operation.

Turning to the input path of the memory of FIG. 10, the memory circuitry may include a double data rate data input bus 1005 comprised of registers/latches/circuitry arranged to provide a first beat of data input at the rising edge of the clock, and a second beat of data input at the falling edge of the clock, or at the rising edge of the complementary clock. Here, for example, such registers/latches/circuitry may include a fourth register or latch 1010 that stores the first beat of data by the rising edge of clock containing write command information, a fifth register or latch 1012 that stores the second beat of data by the falling edge of the clock, or the rising edge of the complementary clock, containing write command information, a sixth register or latch 1011 that stores the output of the fourth register by the rising edge of clock containing write command information, and/or a seventh register or latch 1013 that stores the output of the fifth register by the rising edge of clock containing write command information.

Turning to the output path of the memory of FIG. 10, the memory circuitry may include a double data rate data output bus 1009 comprised of registers/latches/circuitry arranged and electrically connected to provide a first beat of data output at the rising edge of the clock, or at the falling edge of the clock, or at the rising edge of the complementary clock, and a second beat of data output at the opposite clock edge, or the subsequent clock edge of the complementary clock. Further, according to certain implementations, various memory circuitry here may be configured such that sense line widths-are double the width of data output bus, containing both beats of double data rate output. Moreover, in some implementations, the output path may be structured as double width of data output bus and multiplexed (e.g., 2:1, etc.) at the last stage of the output latch.

As to aspects of the address path and match logic, a double data rate address bus 1007 includes a read address at the rising edge of the clock and a write address at the falling edge of the clock, or at the rising edge of the complementary clock. A first address latch or register 1008 stores the read address by the rising edge of the clock, or by the rising edge of the clock containing read command information. A second address latch or register 1016 stores the write address by the falling edge of the clock, or the rising edge of the complementary clock, containing write command information. A third address latch or register 1018 is coupled to the second address switch that stores output data by the rising edge of the clock containing write command information. A read write address multiplexer 1050 is capable of sending the read address output from the first read address latch or register 1008 and the write address output from the third address latch or register 1018 to the memory array in a clock cycle. The read write address multiplexer 1050 sends the read address to the memory array controlled by a self-timed read pulse for read operation. After completion of the self-timed read pulse, the write address is sent to the memory array controlled by a self-timed write pulse for write operation. Such double data rate data input bus may include a first beat of data input at the rising edge of the clock and a second beat of data input at the falling edge of the clock, or at the rising edge of the complementary clock.

Figure 11:
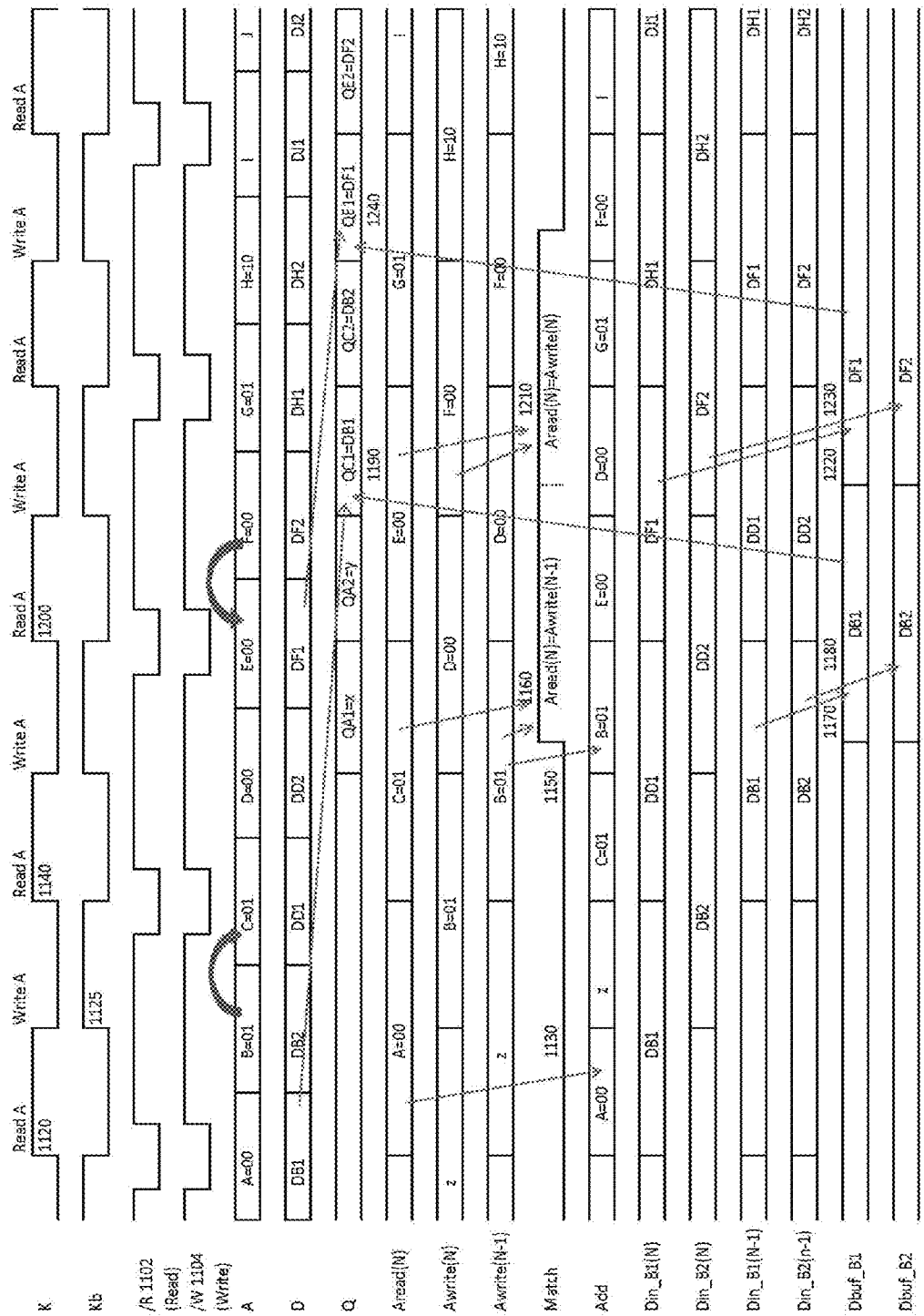
FIG. 11 is a timing diagram depicting illustrative read and write timing aspects, consistent with one or more aspects of the innovations herein.

FIG. 11 is a timing diagram depicting illustrative read and write timing aspects, consistent with one or more aspects of the innovations herein. FIG. 11 illustrates memory with write buffer timing and a read latency of 1.5. If a same address value in a given K clock cycle is held, the loading of the same address as a read address, and then as a matching write address results in the circuit reading or passing-through the latest data input, rather than the data from the previously completed write operation.

As shown on FIG. 11, signal "/R" 1102 is read signal and signal "/W" 1104 is write signal, when presented at the clock rising edge 1120, mean that the present cycle will perform read and write operation. On the K rising edge 1120, read address is presented at the K clock rising edge 1120. As depicted in FIG. 11, address A with value of 00 is presented in the first K rising edge. Address A=00 is stored by latch or register at K rising edge 1120 and output as Aread(N) and is available for the whole clock cycle. Aread(N) A=00 is then processed through Read/Write Address Mux to be outputted as address bus Add, as indicated by reference line 1130. A=00 is then presented on Add bus to read from Memory Core. With RL (Read Latency) of 1.5, DDR outputs corresponding to address A=00 such as QA1=x and QA2=y are presented on the Q bus, 1.5 and 2 clocks after the address, respectively. Write address is presented on the rising edge 1125 of Kb, a half cycle after K rising edge 1120. Write address B=01 is stored by latch or register at Kb rising edge 1125 and output as Awrite(N). The corresponding D inputs DB1 and DB2 are stored on the same clock cycle to Din_B1(N) on K rising edge 1120 and Din_B2(N) on Kb rising edge 1125, respectively. On a next K rising edge 1140, B=01 is shifted to Awrite(N−1), DB1 is shifted to Din_B1(N−1), and DB2 is shifted to Din_B2(N−1). On this same cycle, after read operation of address C=01 is performed, B=01 is mux'ed to Add (line 1150) to send to Memory Core and DB1 and DB2 are written into this location in Memory Core. On read address C=01 operation, Aread(N)=01 is same as Awrite(N−1)=01, as depicted at reference line 1160. A match signal is registered as comparator output because of the matched read and write addresses B and C. DB1 and DB2 are transferred to Dbuf_B1 and Dbuf_B2 at lines 1170, 1180 and are mux'ed at line 1190 to read output bus on Q bus where QC1=DB1 and QC2=DB2. In this case, Q output data is from write buffer, instead of memory core, thereby efficiently bypassing memory retrieval from the memory core. Another case of data bypass is shown on the next cycle 1200 where read address E=00 is same as write address F=00. Consequently, Aread(N) equals to Awrite (N) at the comparison at 1210, and this results in Din_B1(N) and Din_B2(N) being transferred to Dbuf_B1 and Dbuf_B2 at lines 1220 and 1230. Eventually, Q outputs QE1=DF1 and QE2=DF2 from transfer at line 1240. Note that in the E=00 case, D=00 is also same as E=00. But because F=00 the data is newer, therefore, Q takes the data DF1 and DF2, instead DD1 and DD2.

In addition to the above memory innovations and memory architecture, the present inventions also include, inter alia, methods of memory operation, methods of fabricating memory devices consistent with the features and/or functionality herein, products (such as DRAMs or products embodying DRAMs), and products produced via such processes. By way of example and not limitation, methods of memory fabrication herein may include known RAM manufacturing processes such as in CMOS technologies involving aspects such as p-mos and n-mos transistor formation, multiple metallization layers and/or local interconnects, among others. A variety of exemplary/staple processes here, for example, being set forth in the backgrounds/disclosures of U.S. Pat. Nos. 4,794, 561, 5,624,863, 5,994,178, 6,001,674, 6,117,754, 6,127,706, 6,417,549, 6,894,356, and 7,910,427 as well as U.S. patent application publication No. US2007/0287239A1, which are incorporated herein by reference.

In some instances, aspects of the innovations herein may be achieved involving logic and/or logic instructions including program modules, executed in association with the circuitry, for example. In general, program modules may include routines, programs, objects, components, data structures, etc. that performs particular tasks or implement particular logic, control, delay or instructions. The inventions may also be practiced in the context of distributed circuit settings where circuitry is connected via communication buses, circuitry or links. In distributed settings, control/instructions may occur from both local and remote computing elements including memory storage devices.

As disclosed herein, features consistent with the present inventions may be utilized via and/or involved with computer hardware, software and/or firmware. For example, the systems and methods disclosed herein may be embodied in or used in connection with various forms including, for example, memory, data processors, such as in computing devices that also includes memory, a database, digital electronic circuitry, firmware, software, or in combinations of them. Further, while some of the disclosed implementations describe specific hardware components, systems and methods consistent with the innovations herein may be implemented in the context of any combination of hardware, software and/or firmware. Moreover, the above-noted features and other aspects and principles of the innovations herein may be implemented in various memory environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data/instructions embodied in various machine-readable or computer-readable media, in terms of their behavioral, register transfer, logic component, and/or other characteristics. Computer-readable media in which such formatted data and/or instructions may be embodied include, but are not limited to, nonvolatile storage media in various forms (e.g., optical, magnetic or semiconductor storage media), though does not include transitory media such as carrier waves.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the inventions pertain that variations and modifications of the various implementations shown and described herein may be made without departing from the spirit and scope of the innovations herein. Accordingly, it is intended that the inventions be limited only to the extent required by the applicable rules of law.

The invention claimed is:

1. A memory device comprising:
a memory core;
input circuitry that receives a data bus inversion (DBI) bit associated with a data signal as input directly, without transmission through DBI logic associated with an input buffer;
at least one memory circuit that stores the DBI bit into the memory core, reads the DBI bit from the memory core, and provides the DBI bit as output, wherein the memory device stores and processes the DBI bit on an internal data bus as a regular data bit; and
a data buffering circuit coupled to the memory core, the data buffering circuit including a write buffer comprising a data register positioned between the input circuitry and the DBI logic and storing the data to be written into the memory core on a later cycle, an address register storing addresses corresponding to the stored data signal, and a comparator comparing a read address to the addresses stored in the write buffer, wherein data from the data register is retrieved as an output data signal instead of data from the DBI logic when the comparator determines that the address stored in the address register matches the read address, thereby causing the output data signal to bypass the DBI logic.

2. The device of claim 1, wherein the memory core is configured to store the DBI bit to reduce conversion of the data stream and associated power consumption.

3. The device of claim 1, wherein the input circuitry comprises:
a bus driver characterized by a first capacitance load, a second capacitance load and a decoupling capacitor coupled between the first capacitance load and the second capacitance load.

4. The device of claim 1, wherein the input circuitry comprises:
a bus driver characterized by a first capacitance load and a second capacitance load, wherein the maximum bus switching occurs when approximately half of the capacitance loads is high-go-low while the other half of capacitance load is low-go-high.

5. The device of claim 1, wherein the input circuitry comprises:
a bus driver including a first capacitance load supplying a second capacitance load with charge via a decoupling capacitor.

6. A memory device comprising:
a memory array;
local data writing circuitry coupled to the memory array, the local data writing circuitry comprising a local data write driver and a local data bus inversion (DBI) converter circuitry;
wherein the local DBI converter circuitry converts DBI formatted data to non-DBI formatted data; and
wherein the local data writing circuitry writes the non-DBI formatted data to the memory array;
sense circuitry coupled to the memory array to read out the non-DBI formatted data and output sense data;
a DBI formatter circuit coupled to an output of the sense circuitry to format the sense data into DBI formatted data and a DBI bit;
an output buffer coupled to an output of the DBI formatter circuit and outputting the DBI bit and DBI formatted data; and
a data buffering circuit including a write buffer comprising a data register coupled to the local DBI converter circuitry and storing non-converted data to be written into the memory array on a later cycle, an address register storing addresses corresponding to the stored data signal, and a comparator comparing a read address to the addresses stored in the write buffer,
wherein data from the data register is retrieved as an output data signal instead of data from the memory array when the comparator determines that the address stored in the address register matches the read address, thereby causing the non-converted data to bypass the local DBI converter circuitry.

7. The device of claim 6, wherein the memory device is configured to receive and process the DBI formatted data by handling DBI conversion at the local data writing circuitry to reduce current consumption and current spikes.

8. The device of claim 6, wherein the local data writing circuitry comprises:
a bus driver characterized by a first capacitance load, a second capacitance load and a decoupling capacitor coupled between the first capacitance load and the second capacitance load.

9. The device of claim 6, wherein the local data writing circuitry comprises:
a bus driver including a discharge of a first capacitance load supplies charge to a second capacitance load through a decoupling capacitor to reduce power consumption and/or switching noise.

10. The device of claim 6, wherein the local data writing circuitry comprises:
coupling circuitry connected between a power supply bus and a ground bus, wherein the coupling circuitry provides an electrical path between a first capacitance load and a second capacitance load such that charge is supplied to the coupling circuitry from the power supply bus and the first capacitance load to a decoupling capacitor for data bit switching of the first capacitance load, and then the coupling circuitry supplies the charge from the decoupling capacitor to the second capacitance load for data bit switching of the second capacitance load.

11. The device of claim 6, wherein the local data writing circuitry comprises:

coupling circuitry configured to switch data bits in a first capacitance load and provide a charge from the first capacitance load to a decoupling capacitor, and switch data bits in a second capacitance load and provide the charge of the decoupling capacitor to the second capacitance load.

12. The device of claim 1, wherein the DBI logic accepts a data bus and the DBI bit as input.

13. The device of claim 1, wherein the DBI logic provides the DBI bit and outputs to a data bus.

14. The device of claim 1, wherein the device is configured to perform internal data bus processing of the DBI bit into the memory array to thereby reduce current consumption and current spikes.

15. The device of claim 6, wherein the DBI converter logic accepts the DBI formatted data bits and the DBI bit as input.

16. The device of claim 6, wherein the DBI formatter logic outputs the DBI formatted data bits and the DBI bit.

17. The device of claim 1, wherein the memory device is configured to generate the DBI formatted internal data bus to thereby reduce power consumption associated with long global data bus loading in the write operation.

18. A method for memory operation utilizing data bus inversion, method comprising the steps of:
   receiving a data bus inversion (DBI) bit and data bits as input;
   outputting the DBI bit and the data bits to section circuitry;
   storing the data bits in a data register;
   comparing an address stored in an address register with a read address;
   when the address stored in the address register does not match the read address:
      performing DBI converter logic in the section circuitry to convert the data bits;
      writing the converted data bits into bit lines of a memory array;
      reading the converted data bits from the memory array;
      performing DBI formatter logic at an output buffer; and
      outputting the DBI formatted data bits and the DBI bits; and
   when the address stored in the address register matches the read address:
      writing the data bits from the data register into bit lines of a memory array, thereby bypassing the DBI converter logic.

19. The device of claim 1, wherein bypassing the DBI logic reduces power consumption and noise and increases device speed.

20. The device of claim 1, wherein read circuitry coupled to the memory core is configured to perform a non-DBI read operation.

21. The device of claim 6, wherein bypassing the local DBI converter circuitry reduces power consumption and noise and increases device speed.

22. The device of claim 6, wherein read circuitry coupled to the memory array is configured to perform a non-DBI read operation.

23. The method of claim 18, further comprising reading the data written to the memory array via a non-DBI read operation.

* * * * *